United States Patent [19]

Kim

[11] Patent Number: 5,851,341

[45] Date of Patent: Dec. 22, 1998

[54] METHOD FOR MANUFACTURING BEAD FILTER USING AN EPOXY RESIN GEL

[75] Inventor: Chang Sik Kim, Kyongki-Do, Rep. of Korea

[73] Assignee: Samsung Electro-Mechanics Co., Ltd., Kyongki-do, Rep. of Korea

[21] Appl. No.: 546,799

[22] Filed: Oct. 23, 1995

[30] Foreign Application Priority Data

Oct. 27, 1994 [KR] Rep. of Korea ................. 1994--27619

[51] Int. Cl.$^6$ .................................................. B32B 31/00
[52] U.S. Cl. .......................................... 156/294; 156/295
[58] Field of Search .................................... 156/293, 294, 156/295, 305, 307.1; 264/251, 254, 261

[56] References Cited

U.S. PATENT DOCUMENTS

| | | | |
|---|---|---|---|
| 3,945,972 | 3/1976 | Sakamoto | 260/47 |
| 4,370,698 | 1/1983 | Sasaki | 361/330 |
| 5,166,229 | 11/1992 | Nakano et al. | 523/447 |
| 5,200,720 | 4/1993 | Yi | 333/181 |

FOREIGN PATENT DOCUMENTS

94-265  1/1994  Rep. of Korea .

*Primary Examiner*—David W. Wu
*Attorney, Agent, or Firm*—Lowe Hauptman Gopstein Gilman & Berner

[57] ABSTRACT

A method for manufacturing a bead filter for eliminating electromagnetic interference noises generated in electronic apparatuses are disclosed. The present invention improves an adhesive manufacturing process, an adhesive applying process and an adhesive drying process, so that the radial bead filters of the present invention having superior electromagnetic characteristics would be minimally affected by the adhesive, and superior bonding strengths of the radial bead filters can be maintained. The method for manufacturing the bead filter composed of a lead wire and a pair of ferrite cores for eliminating electromagnetic interferences in electronic apparatuses, includes the step of mixing 10–40 wt % of an epoxy powder and 60–90 wt % of benzyl alcohol so as to prepare an epoxy resin gel. With this epoxy resin gel, the bead filters are continuously manufactured with a simple process.

36 Claims, 3 Drawing Sheets

METHOD FOR MANUFACTURING BEAD FILTER USING AN EPOXY RESIN GEL

FIELD OF THE INVENTION

The present invention relates to a method for manufacturing a bead filter for eliminating electromagnetic interference noises generated in electronic apparatuses. More specifically, the present invention relates to a method for manufacturing a bead filter, in which a pair of ferrite cores and a lead wire are continuously coupled together without degrading the performance of the electronic apparatus due to an adhesive layer, thereby improving the productivity.

DESCRIPTION OF THE PRIOR ART

Generally, electromagnetic interferences which are generated in electronic apparatuses propagate through wires or through the empty space, so that noises would be produced in the peripheral apparatuses, thereby causing malfunctions in the peripheral apparatuses.

In order to solve the problem of the electromagnetic interferences, a bead filter is employed.

This bead filter is composed of a pair of ferrite cores each having a through hole, and a lead wire passing through the ferrite cores. The lead wire is fixed to the ferrite cores by means of an adhesive.

Generally, the bead filter requires the following characteristics. That is, the bead filter should have an electromagnetic characteristic similar to the case where the adhesive is not used. The bonding strength of the coupled ferrite core and the lead wire, which is determined by the adhesive, should be superior. Further the productivity should be also superior.

That is, when the ferrite cores and the lead wire are coupled by using adhesive, the bonding strength between them and the electromagnetic characteristics of the bead filter should be same as when the adhesive is not used. Further, the productivity should be superior.

In manufacturing the bead filter, the adhesive is filled into the ferrite core so as to fix the lead wire to the ferrite core.

When the adhesive is filled into the ferrite core to fix the lead wire thereto, the adhesive shrinks while drying which causes a contraction stress on the surface of the ferrite core, resulting in aggravation of material uniformity. Particularly, when the adhesive is filled into the ferrite core, a core magnetic resistance is formed, with the result that the electromagnetic characteristics, particularly impedance |Z| is lowered.

Meanwhile, the adhesive which is used in manufacturing the bead filter is known to include epoxy based adhesives, resin based adhesives, and phenol based adhesives.

If the above mentioned adhesives are used, the cost is low, and the drying time period is shortened so as to improve productivity. However, generally, they are used in the form of a solution (dipping process), and therefore, the contraction ratio is large compared with other adhesives. Therefore, the internal stress becomes much larger. Further, the resin adheres onto the surface of the ferrite core, and is solidified, with the result that the electromagnetic characteristics are extremely aggravated. Further, the material properties of the adhesive are unstable in the frequency bands of several scores to several hundreds of MHz (generally 50–300 MHz), and thus, the high frequency characteristics are aggravated, so that product reliability cannot be assured.

In the case where phenol based adhesives are used, there is an advantage that the contraction stress during drying is low. However, the bonding strength is very low, and therefore, if the lead wire is to be bonded to the ferrite core, a large amount of the adhesive has to be used which generates dimensional defects. Also the required bonding strength value (the bonding strength between the core and the lead wire: 3–5 kgf) cannot be attained at the automatic bonding machine at normal temperature. Therefore, the mechanical strength of the product cannot be ensured. Further, the drying time is lengthy in relative terms, and therefore, productivity is lowered.

Meanwhile, in the case where the epoxy based adhesives are used, the aggravation of the electromagnetic characteristics is low compared with other adhesives. Further, their thermosetting property is high, and therefore, the bonding strength is high. Meanwhile, their productivity is almost similar to the resin based adhesives.

Therefore, the epoxy based adhesives are widely used in manufacturing the bead filter.

Meanwhile, the bead filter for eliminating the electromagnetic interferences is classified into axial and radial types. Currently, the radial bead filters are widely used.

FIG. 1 schematically illustrates a conventional method for manufacturing the radial bead filter with epoxy based adhesive.

Figure 1A:
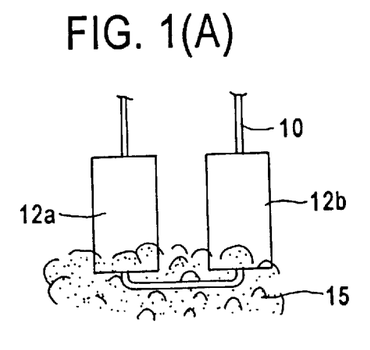
FIG. 1A illustrates a process using an epoxy powder as the adhesive.

The manufacturing method of FIG. 1A is carried out in the following manner. A pair of ferrite cores 12a and 12b having through holes (14a) and (14b) are each first fitted to a U shaped lead wire 10. The assembly is lowered vertically downward so that an epoxy powder 15 adheres onto the ferrite cores 12a and 12b and the lead wire 10, thereby completing the manufacturing of the bead filter.

In this method, however, prior to applying the epoxy powder 15, the ferrite cores 12a and 12b and the lead wire 10 are pre-heated, and at least three rounds or more of epoxy powder applying process have to be carried out. Therefore, the manufacturing facility and the complication of the manufacturing process are accompanied.

Figure 1B:
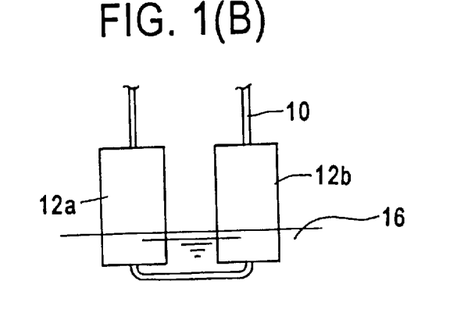
FIG. 1B illustrates another process using a liquid epoxy resin as the adhesive.

The manufacturing method of FIG. 1B is carried out in the following manner. A pair of ferrite cores 12a and 12b are first fitted to a U shaped lead wire 10. This assembly is then dipped into a liquid epoxy resin 16 so that the ferrite cores 12a and 12b and the lead wire 10 are bonded together to complete the manufacturing of the bead filter. In this method, however, when the liquid epoxy resin 16 is solidified, mechanical stresses are accumulated on the surfaces of the ferrite cores 12a and 12b, so that the electromagnetic characteristics of the finished products may be aggravated.

Figure 1C:
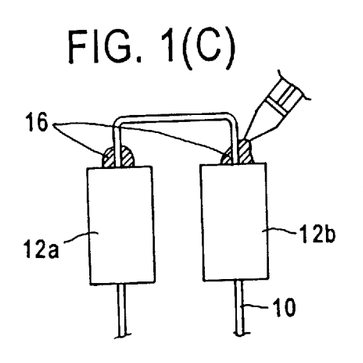
FIG. 1C illustrates still another process using a liquid epoxy resin as the adhesive.

The manufacturing method of FIG. 1C is carried out the following manner. A pair of ferrite cores 12a and 12b are fitted to a U shaped lead wire 10. A liquid epoxy resin 16 is then spread on the assembly of the ferrite cores 12a and 12b and the lead wire 10, to complete the manufacture of the bead filter. In this method, however, the assemblies of the ferrite cores 12a and 12b and the lead wire 10 have to be spread with the liquid epoxy resin 16 individually adversely affecting production speed.

Figure 1D:
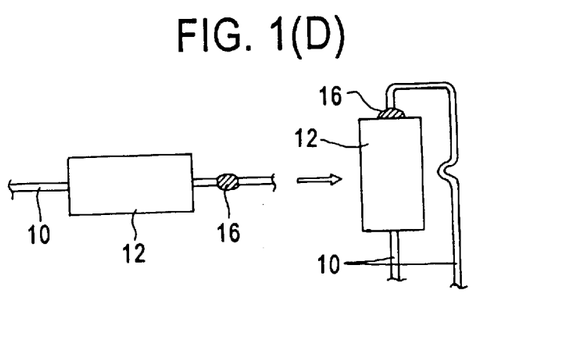
FIG. 1D illustrates still another process for bend-forming the lead wire.

The manufacturing method of FIG. 1D is carried out in the following manner. A ferrite core 12 is fitted to a straight lead wire 10. An epoxy resin is then spread on the assembly. The lead wire 10 is bent into a certain contour, thereby completing the manufacture of the bead filter. In this method, however, the manufacturing process is complicated.

Meanwhile, in the manufacturing method for the axial bead filter, an epoxy based adhesive is used, and an endless chain is utilized to carry out a continuous process.

In this method, however, although productivity is superior, but the adhesive contracts during solidification, with the result that stress is accumulated on the surface of the ferrite core. Due to the accumulated stress, dislocations occur in the crystal structure of the ferrite core, so that the uniformness throughout the lattices is aggravated. Consequently, the electromagnetic characteristics such as impedance and inductance are aggravated.

SUMMARY OF THE INVENTION

The present inventor carried out studies and experiments repeatedly to overcome the above described disadvantages of the conventional techniques.

Therefore it is an object of the present invention to provide a method and an apparatus for manufacturing a bead filter, in which the adhesive manufacturing process, the adhesive applying process and the drying process are improved so as to minimize the aggravation of the electromagnetic characteristics and to improve the bonding strength, and in which the bead filter is made to be produced in a continuous manner, so as to improve the productivity.

It is another object of the present invention to provide an apparatus for manufacturing a bead filter, in which the productivity is improved.

In achieving the above objects, the method for manufacturing the bead filter composed of a lead wire and a ferrite core having a through hole each, for eliminating electromagnetic interferences in electronic apparatuses according to the present invention includes the steps of:

mixing 10–40 wt % (to be called % below) of epoxy powder and 60–90% of benzyl alcohol so as to prepare an epoxy resin gel;

defoaming the epoxy resin gel;

making a plurality of lead wires ready;

deciding a portion of the lead wire where the epoxy resin gel is to be applied;

inserting each of the lead wires into each of the ferrite cores, and conveying the lead wires separated with certain intervals;

positioning each of the cores so as for the epoxy resin gel applied portion of the lead wire not to be disposed within the through hole of the ferrite core;

applying the defoamed epoxy resin gel to the epoxy resin gel applying portion of each of the continuously carried lead wires;

rotatingly moving the ferrite core up to a final position on the lead wire after passing the portion of the applied epoxy resin gel, so as to form a resin layer between the inside of the through hole and the outside of the lead wire; and drying the formed resin layer at a temperature of 150°–400° C., whereby the lead wire and the ferrite core are bonded together.

In another aspect of the present invention, the apparatus for manufacturing the bead filter according to the present invention includes:

a means for moving a lead wire inserted into a ferrite core;

a body portion for guiding and supporting the moving means;

first and second inclined plates for moving the ferrite cores in the opposite directions, and attached to the body portion;

a drying furnace installed at a side of the body portion adjacently to the second inclined plate; and an adhesive applying means installed between the first and second inclined plates, for applying the adhesive to the lead wire.

BRIEF DESCRIPTION OF THE DRAWINGS

The above object and other advantages of the present invention will become more apparent by describing in detail the preferred embodiment of the present invention with reference to the attached drawings in which:

FIG. 1 illustrates a conventional process for manufacturing the radial bead filter, in which:

FIG. 3 is a detailed illustration of the apparatus of FIG. 2, in which:

DESCRIPTION OF THE PREFERRED EMBODIMENT

In manufacturing the bead filter according to the present invention, first an epoxy resin gel is prepared.

In order to prepare the epoxy resin gel, an epoxy powder in an amount of 10–40% and benzyl alcohol in an amount of 60–90% are mixed together.

The epoxy powder is added to give the bonding strength, and the composition of the epoxy powder is as follows.

That is, the epoxy powder which is preferably employed in the present invention is composed of: 40–80% of resin, 10–50% of $SiO_2$, less than 20% of $Al_2O_3$, less than 10% of $Sb_2O_3$, and less than 5.0% of $TiO_2$, PbO, SnO and CaO (This is also called "A type epoxy powder").

Or the resin powder of the present invention is composed of: 40–80% of resin, less than 20% of $SiO_2$, 10–50% of $Al_2O_3$, less than 10% of $Sb_2O_3$, and less than 5.0% of $TiO_2$, PbO, SnO and CaO (This also called "B type epoxy powder").

Of the A type epoxy powders, the one which is preferably employed in the present invention is composed of: 50–70% of resin, 25–40% of $SiO_2$, 1–13% of $Al_2O_3$, 2–5% of $Sb_2O_3$, and 0.1–2.0% of $TiO_2$, PbO, SnO and CaO.

Of the B type epoxy powders, the one which is preferably employed is composed of: 50–70% of resin, 1–13% of $SiO_2$, 25–40% of $Al_2O_3$, 2–5% of $Sb_2O_3$, and 0.1–2.0% of $TiO_2$, PbO, SnO and CaO.

The A type and B type epoxy powders are desirably made to contain 20–70% of a resin (bisphenol A: called "BPA" below), and/or they are desirably made to contain 1–5% of a multi functional anhydrite.

If the BPA or the multi functional anhydrite are added, the bonding strength is reinforced.

Meanwhile, if the content of the epoxy powder is less than 10%, then the amount of benzyl alcohol which serves as a solvent is increased in the relative terms, and therefore, a sufficient bonding strength is not provided. On the other hand, if its content is more than 40%, the solid component is increased, and therefore, gellizing becomes difficult, with the result that the viscosity becomes too high, and that the distribution of the resin component becomes non-uniform. Therefore, it is desirable to limit the content of the epoxy powder to 10–40%.

When preparing the epoxy resin gel, a stabilizer may be desirably added for inhibiting the evaporation of benzyl alcohol.

The stabilizer includes acetone and ethyl alcohol, and one or both of them may be mixed in an amount of less than 8% in a mixture of the epoxy powder and benzyl alcohol.

If the content of the stabilizer is more than 8%, the resin in benzyl alcohol is dissolved, and therefore, the viscosity is lowered. Particularly, in the case of acetone, it is bonded with the epoxy resin so as to make the polymer decomposed.

The mixing may be desirably carried out by applying a ball milling process. The mixing time may be 1–12 hours, and preferably 2–5 hours. The ball milling speed should be preferably 50–150 rpm, and the ball jar size should be preferably 150–200 mm.

Meanwhile, for the epoxy resin gel prepared by mixing in the above described method, the cakes should be filtered off. The fineness of the sieve should be preferably 250 meshes or more, or preferably 250–325 meshes, so that a superior filtering effect can be obtained.

Then for the epoxy resin gel prepared in the above described manner, a process of removing bubbles has to be carried out.

The defoaming time should be preferably 10–36 hours, and the reason is as follows. If the defoaming time is less than 10 hours, a sufficient defoaming cannot be carried out, while if the defoaming time is more than 36 hours, benzyl alcohol as solvent is evaporated. A more preferable defoaming time should be 10–24 hours.

By carrying out the defoaming treatment as described above, the bonding defects due to the expansion of bubbles can be eliminated during the drying of the epoxy resin layer.

Meanwhile the viscosity of the epoxy resin gel should be maintained preferably at 30–100 cps, and the reason is as follows. If it is less than 30 cps, the fluidity is too large, and therefore, the epoxy resin gel cannot be easily made to adhere onto the lead wire, as well as that a sufficiently thick bonding resin layer cannot be obtained. On the other hand, if the viscosity of the epoxy resin gel is more than 100 cps, a bonding resin layer of a uniform thickness cannot be obtained. A more preferable viscosity of the epoxy resin gel is 30–50 cps.

After preparing the epoxy resin gel in the above described manner, the epoxy resin gel is applied to the lead wire so as to form a bonding resin layer between the lead wire and the ferrite core. Then the bonding resin layer is dried, and this will be described in detail below.

That is, a plurality of lead wires are made ready, and then, the positions on the lead wires on which the epoxy resin gel is to be applied are determined.

The epoxy resin gel applying position on the lead wire is determined as follows. That is, the epoxy resin gel is applied such that the length of the adhesive resin layer should be equivalent to more than 50% of the length of the ferrite core. More preferably the epoxy resin gel is applied such that the length of the adhesive resin layer should be equivalent to 50–90% of the length of the ferrite core.

If the length of the adhesive resin layer is less than 50% of the length of the ferrite core, then the length of the adhesive resin layer is too short, with the result that the bonding strength is too weak. If the length of the adhesive resin layer is more than 90% of the length of the ferrite core, the workability is aggravated, although the bonding strength is superior.

The lead wire is then inserted into the ferrite core, and the assembled lead wires and ferrite cores are continuously conveyed.

Then the position of the ferrite core is decided such that the bonding resin applying position would be disposed within the through hole of the ferrite core.

Then the defoamed epoxy resin is applied to the above described position on the lead wire.

Then the ferrite core is rotatingly fitted to the lead wire to the final position after passing the resin applied position, so that a bonding resin layer would be formed between the inside of the through hole of the ferrite core and the outside of the lead wire.

When the ferrite core advances toward the epoxy resin which is applied on the lead wire, the ferrite core has to be rotatingly advanced. The reason is as follows. That is, the epoxy resin gel has to be uniformly spread between the inside of the through hole and the outside of the lead wire, so that a uniform bonding resin layer would be formed.

Then the bonding resin layer is dried at a temperature of 150°–400° C., so that the lead wire and the ferrite core would be firmly bonded together, thereby completing the manufacturing of the bead filter.

If the drying temperature is below 150° C., benzyl alcohol which is an organic solvent remains, with the result that the bonding strength is aggravated. On the other hand, if the drying temperature is over 400° C., the epoxy resin powder is carbonized, with the result that the bonding layer becomes brittle.

A more preferable drying temperature is 250°–350° C.

When drying the bonding resin layer, the drying time should be preferably 30 seconds to 10 minutes, more preferably 1–5 minutes.

If the drying time is less than 30 seconds, a sufficient drying cannot be realized, while if the drying time is more than 10 minutes, the epoxy resin powder is carbonized, with the result that the bonding resin layer becomes brittle.

As to the drying method for drying the bonding resin layer, stepwise heating zones may be desirably formed, so that a speedy evaporation of the organic solvent can be prevented.

As to the stepwise heating zone method, a 2-step drying zone method or a 3-step drying zone method may be adopted.

The 2-step drying zone method may desirably include:
a pre-heating part for heating the bonding resin layer at a temperature of 100°–250° C.; and a drying part for finally drying the bonding resin layer at a temperature of 250°–400° C. The pre-heating time should be preferably less than 8 minutes, while the drying time should be preferably 30 seconds to 2 minutes.

The 3-step drying zone method may desirably include: a pre-heating part for pre-heating the bonding resin layer at a temperature of 100°–200° C.; a drying part for finally drying the bonding resin layer at a temperature of 200°–400° C.; and a cooling part for carrying out a cooling down to a temperature of 50°–250° C. The pre-heating time should be preferably 30 seconds to 4 minutes, the drying time should be preferably 30 seconds to 2 minutes, and the cooling time should be preferably less than 4 minutes.

In employing the stepwise drying zone method, the drying temperature and the drying time have to be properly controlled by taking into account the evaporation of the organic solvent during the pre-heating, the removing of the bubbles of the epoxy resin gel, and the carbonization of the epoxy resin during the drying.

Now the apparatus for manufacturing a bead filter according to the present invention will be described.

Figure 2:
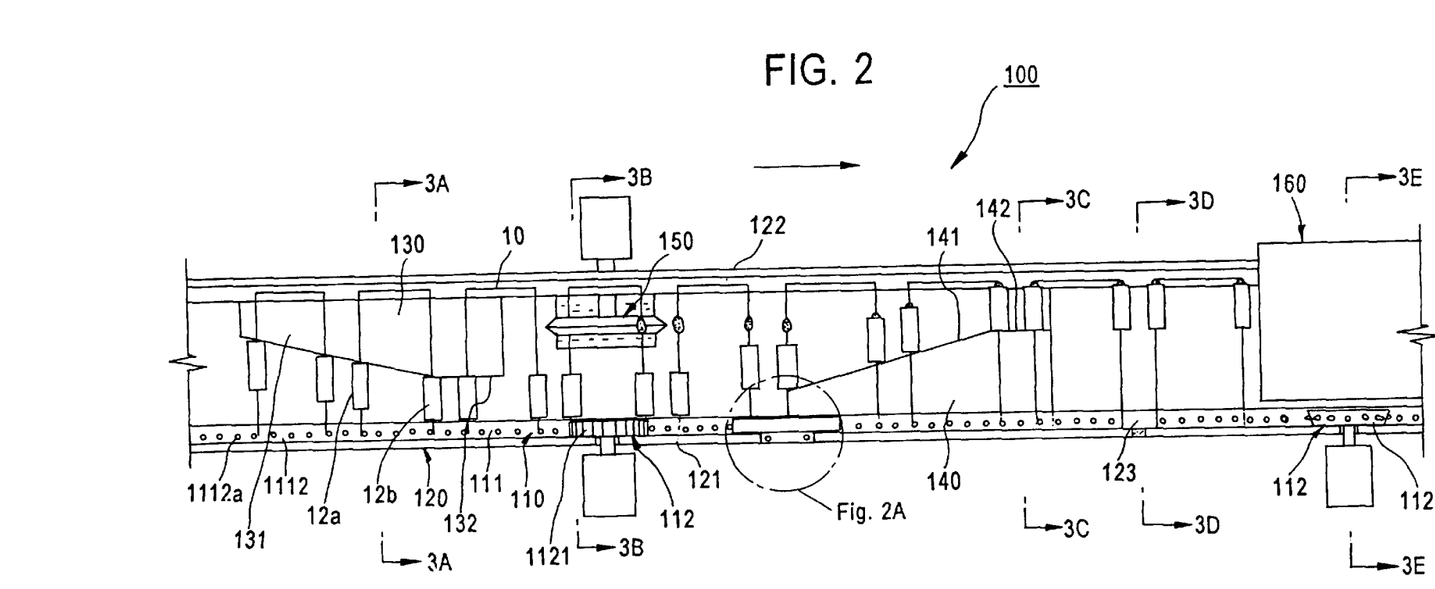
FIGS. 2 and 2A are a partial plan view of the apparatus for manufacturing the radial bead filter according to the present invention.
Figure 2A:
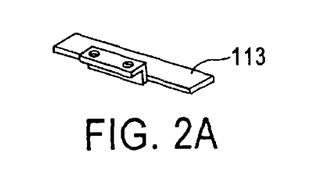

As shown in FIGS. 2 and 3, a radial bead filter manufacturing apparatus 100 according to the present invention includes:

a conveying means 110 for conveying lead wires 10, each of the lead wire 10 inserted into a pair of ferrite cores 12a and 12b;

a body portion 120 for guiding and supporting the conveying means 110;

first and second inclined plates 130 and 140 coupled to the body portion 120, for moving the ferrite cores 12a and 12b in the opposite directions;

a bonding means 150 installed between the first and second inclined plates 130 and 140, for applying the adhesive to the lead wire 10; and a drying furnace 160 installed at a side of the body portion 120 adjacently to the second inclined plate 140.

The conveying means 110 includes: a conveying strip 111 for conveying assemblies of the lead wires 10 and the ferrite cores 12a and 12b; and a conveying strip moving device 112 for moving the conveying strip 111.

The conveying strip 111 includes a strip shaped base paper 1111 positioned under the lead wires 10; and a tape 1112 for securing the lead wires 10 onto the base paper 1111.

On the base paper 1111 and the tape 1112, there are formed a plurality of pin holes 1112a with certain intervals for facilitating the conveying of the lead wires 10. The tape 1112 should be preferably a thermal tape having a superior adhesive strength.

The conveying strip moving device 112 is driven by a driving source (not shown), and includes a plurality of gear rollers 1121 and pin rollers 1122 for moving the conveying strip 111.

The pin roller 1122 includes a plurality of pins 1122a at the same intervals as those of the pin holes 1112a which are formed on the tape 1112.

The body portion 120 includes: a first guiding part 121 for guiding the conveying strip 111; and a second guiding part 122 disposed opposingly with the first guiding part 121, for guiding the lead wires 10.

The first guiding part 121 is expanded beyond the drying furnace 160, and includes a first guiding face 121a and a first expanding part 121b. The base paper 1111 of the conveying strip 111 is positioned on the first guiding face 121a, and a plurality of the gear rollers 1121 and the pin rollers 1122 are connected to the first expanding part 121b in a drivable manner.

Further, the first guiding face 121a is provided with pin accommodating holes 1211a for accommodating the pins 1122a of the pin rollers 1122.

Further, the second inclined plate 140 is fixed on the first guiding part 121, for conveying the ferrite cores 12a and 12b toward the second guiding part 122.

As shown in the enlarged portion of FIG. 2, the first expanding part 121b is desirably provided with a conveying strip guide 1113 for preventing the departure of the conveying strip 111.

At a position on the first expanding part 121b of the first guiding part 121 which corresponds to between the rear end of the second inclined plate 140 and the leading end of the drying furnace 160, there is desirably installed a tap holder 123.

Figure 3A:
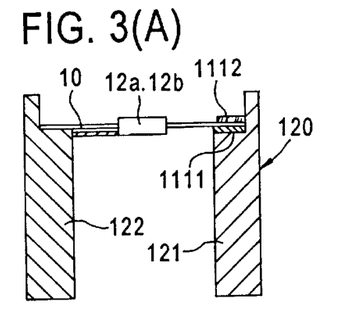
FIG. 3A is a sectional view taken along a line 3A—3A of FIG. 2.
Figure 3B:
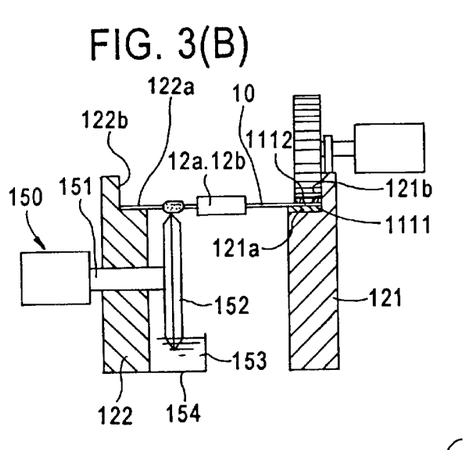
FIG. 3B is a sectional view taken along a line 3B—3B of FIG. 2.
Figure 3C:
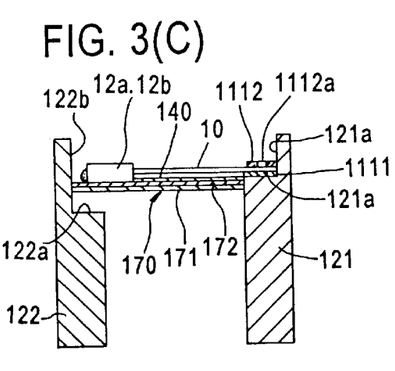
FIG. 3C is a sectional view taken along a line 3C—3C of FIG. 2.
Figures 3D, 3F:
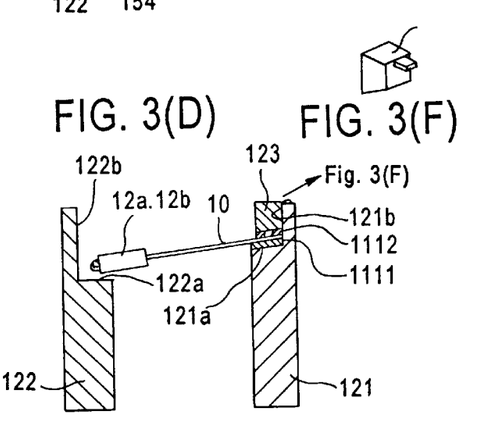
FIG. 3D is a sectional view taken along a line 3D—3D of FIG. 2.
FIG. 3F is a perspective view of a tap holder.
Figure 3E:
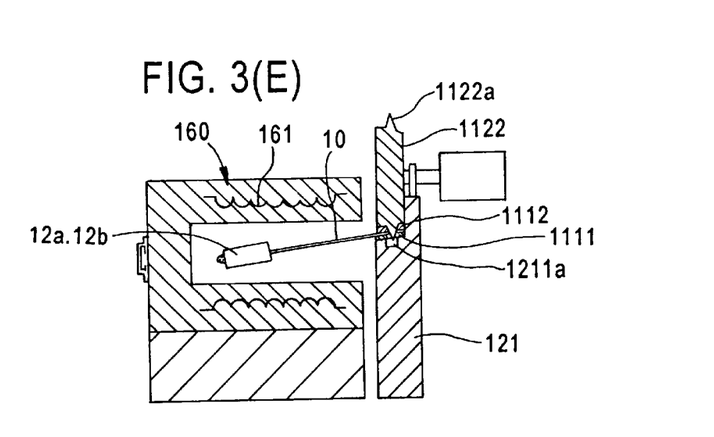
FIG. 3E is a sectional view taken along a line 3E—3E of FIG. 2.

The first guiding face 121a of the first guiding part 121 which corresponds to between the leading end of the tap holder 123 and the rear end of the drying furnace 160 should be inclined by a certain degree $\Theta$, preferably by 20° C., as shown in FIGS. 3D and 3E.

The tap holder 123 (FIG. 3F) is positioned such that it has a conveying strip retaining hole 123a, so that the conveying strip 111 can pass through between the tap holder 123 and the first guiding face 121a. Thus the tap holder 123 makes the conveying strip 111 downwardly inclined.

That is, the conveying strip 111 which passes through the tap holder 123 moves in an inclined posture above the body portion and the drying furnace.

Meanwhile, the second guiding part 122 is expanded up to the leading end of the drying furnace 160, and the second guiding part 122 is provided with a second guiding face 122a and a second expanded part 122b, while the lead wire 10 is positioned on the second guiding face 122a.

As shown in FIG. 3A, The second guiding face 122a has a level lower than that of the first guiding face 121a by as much as the thickness of the base paper 1111.

Further, the first inclined plate 130 is fixed on the second guiding part 122, for moving the ferrite cores 12a and 12b toward the first guiding part 121.

When observed in the direction of the movement of the lead wires 10, the second guiding face 122a of the second guiding part 122, which corresponds to between the leading end of the second inclined plate 140 and the leading end of the drying furnace 160, is cut off, so that the moving ferrite cores 12a and 12b would be disposed above the second guiding face 122a, as shown in FIG. 3C.

The first inclined plate 130 includes a first inclined face 131 and a first horizontal face 132, and the second inclined plate 140 includes a second inclined face 141 and a second horizontal face 142.

The first and second inclined plates 130 and 140 are positioned under the lead wire 10, so that the ferrite cores can be properly moved.

Below the second inclined plate 140, there is desirably installed a ferrite core rotating means 170 which includes a rubber sheet 172 supported by a supporting plate 171.

The rubber sheet 172 rotates the ferrite cores when moving the ferrite core toward the adhesive of the lead wire 10.

Therefore, the rubber sheet 172 should be contacted with the ferrite core during the moving of the ferrite core. Further, the ferrite cores should be rotatable and movable on the lead wire, and therefore, the size and shape of the second inclined plate 140 are limited, so that the second inclined plate 140 would not cover the through hole upon contacting the ferrite core.

Meanwhile, as shown in FIG. 3B, an adhesive applying means 150 which is installed between the first and second inclined plates 130 and 140 includes: an adhesive applying wheel 152 driven by a driving shaft 151 connected to a driving source (not shown); and an adhesive storage tank 154 for storing an adhesive 153.

The adhesive applying wheel 152 is installed at a side of the second guiding part 122, so that the adhesive 153 of the adhesive storage tank 154 can be properly applied to the moving lead wires 10.

Meanwhile, the drying furnace 160, which is installed separated from the second inclined plate 140, and which is for drying the adhesive resin layer, has an opening near the first guiding part 121, so that the lead wires 10 can pass through the drying furnace 160.

The drying furnace 160 should preferably include a heating coil 161.

Now the method for manufacturing the radial bead filter by using the above described apparatus will be described.

In order to manufacture the radial bead filters by using the radial bead filter manufacturing apparatus according to the present invention, first a pair of ferrite cores 12a and 12b are fitted to each of a plurality of the U shaped lead wires. Then the lower portion of the lead wires 10 are positioned on the base paper 1111 which is moved by a conveying strip moving device 112 over the first guiding face 121a of the first guiding part 121 of the body portion 120. Then a tape 1112 is put to fix the lead wires 10 to the base paper 1111.

As shown in FIG. 3A, the lead wires 10 which have been fixed onto the base paper pass the first inclined plate 130. Under this condition, the ferrite cores 12a and 12b which are fitted to each of the lead wires 10 are made to move toward the first guiding part 121 by the first inclined plate 130 which is fixed on the second guiding part 122.

After the ferrite cores 12a and 12b are carried to the first guiding part 121, they pass the adhesive applying wheel 152.

Under this condition, as shown in FIG. 3B, the adhesive 153 is applied to the lead wire 10 by the rotating action of the adhesive applying wheel 152.

In the case where the adhesive is an epoxy resin gel, the applying amount of the adhesive should be preferably 0.05–1.0 g, more preferably 0.1–0.5 g, assuming that the diameter of the lead wire 10 is 0.6 mm.

The applying amount of the epoxy resin gel should be varied in accordance with the moving velocity of the conveying strip 111 and the revolution speed of the adhesive applying wheel 152.

Therefore, the velocity of the conveying strip 111 and the revolution speed of the adhesive applying wheel 152 should be properly controlled, so that a proper adhesive applying amount can be obtained.

After applying the epoxy resin gel in the above described manner, the lead wires are made to pass through the second inclined plate 140 as shown in FIG. 3C.

Under this condition, the lead wire 10 is made to rotatingly move toward the epoxy resin gel by the second inclined plate 140, and therefore, an adhesive resin layer is formed in the through hole of each of the ferrite cores.

When the ferrite cores 12a and 12b arrive at the applied epoxy resin gel, if the ferrite cores 12a and 12b rotatingly arrive, the applied epoxy resin gel is spread between the inside of the through holes of the ferrite cores 12a and 12b and the outside of the lead wire 10, with the result that a uniform resin layer is formed.

The rotation of the ferrite cores is caused by the rubber sheet 172 which is installed beneath the second inclined plate 140.

Figure 4:
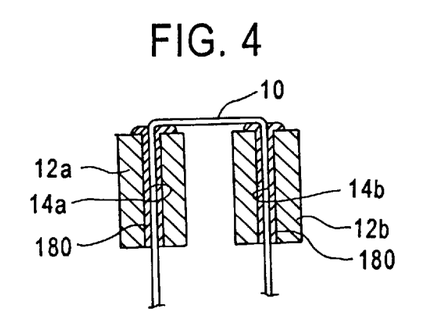
FIG. 4 is a schematic sectional view showing an example of the radial bead filter according to the present invention.

After the formation of the adhesive resin layer in the through holes 14a and 14b, the ferrite cores pass the tap holder 123 with an inclination angle Θ, preferably 20°, with the result that the adhesive layer is dried. Consequently, as shown in FIG. 4, there is obtained a radial bead filter in which an adhesive resin layer 180 is formed between the outside of the lead wire 10 and the insides of the through holes 14a and 14b of the ferrite cores 12a and 12b.

The ferrite cores and the lead wires are made to pass through the drying furnace 160 with an inclination angle Θ, preferably with 20°, so that the ferrite cores can be stably fixed to the adhesive layer.

When the adhesive layer which is formed between the lead wire and the ferrite core is dried in the drying furnace, the drying temperature should be preferably 150°–400° C., and more preferably 250°–350° C.

The drying time should be preferably 30 second to 10 minutes, and more preferably 0.1–5 minutes.

In the bead filter according to the present invention, the bonding strength between the ferrite cores 12a and 12b and the lead wire 10 becomes high. Further, the affection of the electromagnetic characteristics of the ferrite cores by the adhesive layer is minimized.

<EXAMPLE 1>

An epoxy powder having a composition as shown in Table 1 below was mixed with benzyl alcohol. Then stabilizing agents were added as shown in Table 2 below, thereby preparing epoxy resin gels having the viscosities as shown in Table 2 below.

The mixing was carried out by applying a ball milling process.

Then the epoxy resin gels manufactured in the above described manner were subjected to defoaming treatments for 16 hours each.

Then by using the apparatus of FIG. 2, each of the epoxy resin gels was applied to each of U shaped lead wires of 0.6 mm φ in an amount of 0.4 g, and then, an adhesive resin layer was formed between the inside of the through hole of the ferrite core and the outside of the lead wire. Then the adhesive resin layer was dried, thereby manufacturing the radial bead filters.

The ferrite core used in the above was made of a Ni-Zn ferrite (permeability: 900–1000), and its size was 3.5 (outside diameter)×6.0 (length)×0.9 (inside diameter) mm.

The lead wire is an Sn-Pb coated Cu wire of 0.6 mmφ.

The drying temperature was 300° C., and the drying time was 3 minutes.

For the radial bead filters manufactured in the above described manner, impedances and the bonding strengths were measured, and the results are shown in Table 3 below.

In Table 1 below, the contents of the BPA resin show values relative to the resin amount, and the contents of the multi functional anhydrite show values relative to the amount of the epoxy powder.

In table 2 below, a sieve of 250 meshes was used in carrying out the filtering.

In Table 3 below, the impedances were measured by using an impedance gain analyzer HP 4194A (at 100 MHz).

TABLE 1

[Composition of Epoxy Powders]

| Epoxy powder No. | Composition (wt %) | | | | | BPA resin | Multi functional anhydrite | Remark |
|---|---|---|---|---|---|---|---|---|
| | Resin | SiO$_2$ | Al$_2$O$_3$ | Sb$_2$O$_3$ | Other ingredients | | | |
| Inventive powders | | | | | | | | |
| 1 | 70.0 | 27.0 | 1.0 | 1.0 | PbO: 1.0 | 20 | 1.0 | A |
| 2 | 64.0 | 25.0 | 8.0 | 2.0 | PbO: 0.5 SnO: 0.5 | 40 | — | type adhesive |
| 3 | 50.0 | 39.0 | 5.0 | 5.0 | SnO: 0.5 CaO: 0.5 | — | 5.0 | |
| 4 | 53.0 | 40.0 | 5.0 | 2.0 | tr. | — | — | |
| 5 | 60.0 | 25.0 | 7.0 | 7.0 | CaO: 1.0 | 50 | 3 | |
| 6 | 60.0 | 9.0 | 28.0 | 2.0 | TiO$_2$: 0.5 PbO: 0.5 | 35 | 2 | B type adhesive |
| 7 | 60.0 | 12.0 | 25.0 | 2.0 | SnO: 0.5 TiO$_2$: 0.5 | 45 | 3 | |
| 8 | 65.0 | 2.0 | 27.0 | 5.0 | SnO: 0.5 TiO$_2$: 1.0 | 65 | 2 | |
| 9 | 50.0 | 6.0 | 40.0 | 3.0 | SnO: 1.0 | 70 | — | |
| 10 | 70.0 | 5.0 | 22.0 | 2.0 | TiO$_2$: 1.0 | 60 | — | |

TABLE 2

[Epoxy Resin Gel]

| Epoxy resin gel No. | Composition(wt %) | | | | Viscosity (cps) | Remark |
|---|---|---|---|---|---|---|
| | Epoxy powder | Benzyl alcohol | Stabilizer | Filtering | | |
| Comparative resin gel a | 60.0 | 40.0 | — | X | 244 | Inventive powder 1 |
| Inventive resin gel 1 | 10.0 | 90.0 | Aceton 1.0 | X | 32 | |
| Comparative resin gel b | 5.0 | 95.0 | — | X | 17 | |
| Comparative resin gel c | 55.0 | 45.0 | — | O | 182 | Inventive powder 2 |
| Inventive resin gel 2 | 20.0 | 80.0 | Ethyl Alcohol 1.0 | O | 51 | |
| Comparative resin gel d | 2.0 | 98.0 | — | O | 11 | |
| Comparative resin gel e | 70.0 | 30.0 | Aceton 1.0 | X | Unmeasurable | Inventive powder 3 |
| Inventive resin gel 3 | 30.0 | 70.0 | Aceton 1.0 Ethyl Alcohol 1.0 | X | 84 | |
| Comparative resin gel f | 9.0 | 91.0 | — | X | 19 | |
| Comparative resin gel g | 50.0 | 50.0 | Ethyl Alcohol 1.0 | X | 210 | Inventive powder 4 |
| Inventive resin gel 4 | 40.0 | 60.0 | — | X | 99 | |
| Comparative resin gel h | 4.0 | 96.0 | Aceton 1.0 | X | 13 | |
| Comparative resin gel i | 65.0 | 35.0 | Ethyl Alcohol 5.0 | O | Unmeasureble | Inventive powder 5 |
| Inventive resin gel 5 | 35.0 | 65.0 | Acenton 5.0 | O | 91 | |
| Comparative resin gel j | 90.0 | 10.0 | Ethyl Alchol 7.0 | O | Unmeasurable | |
| Comparative resin gel k | 82.0 | 18.0 | Ethyl Alcohol 1.0 | O | Unmeasurable | Inventive powder 6 |
| Inventive resin gel 6 | 10.0 | 90.0 | Acenton 8.0 | X | 34 | |
| Comparative resin gel l | 75.0 | 25.0 | Ethyl Alcohol 6.0 | X | Unmeasurable | |
| Comparative resin gel m | 55.0 | 45.0 | — | O | 192 | Inventive powder 7 |
| Inventive | 20.0 | 80.0 | Acenton 1.0 | O | 36 | |

TABLE 2-continued

[Epoxy Resin Gel]

| Epoxy resin gel No. | Epoxy powder | Benzyl alcohol | Stabilizer | Filtering | Viscosity (cps) | Remark |
|---|---|---|---|---|---|---|
| resin gel 7 | | | | | | |
| Comparative resin gel n | 2.0 | 98.0 | — | O | 13 | |
| Comparative resin gel o | 70.0 | 30.0 | — | O | Unmeasurable | Inventive powder 8 |
| Inventive resin gel 8 | 30.0 | 70.0 | Ethyl Alcohol 5.0 | X | 84 | |
| Comparative resin gel p | 8.0 | 92.0 | Aceton 2.0 | O | 12 | |
| Comparative resin gel q | 60.0 | 40.0 | — | X | 231 | Inventive powder 9 |
| Inventive resin gel 9 | 40.0 | 60.0 | Aceton 3.0 Ethyl Alcohol 2.0 | X | 96 | |
| Comparative resin gel r | 4.0 | 96.0 | — | X | 10 | |
| Comparative resin gel s | 72.0 | 28.0 | Aceton 3.0 | O | Unmeasurable | Inventive powder 10 |
| Inventive resin gel 10 | 15.0 | 85.0 | — | O | 34 | |
| Comparative resin gel t | 75.0 | 25.0 | Ethyl Alcohol 5.0 | O | Unmeasurable | |

O: Filtering carried out.
X: Filtering not carried out.

In table 2, the contents of the stabilizer show values relative to the mixture amount of epoxy powder and benzyl alcohol.

TABLE 3

| Bead filter No. | Impedance (Ω) | Bonding strength (kgf) | Resin gel No. | Remarks |
|---|---|---|---|---|
| Comparative filter a | 86.0 | 1.21 | Comparative resin gel a | Too much resin gel applied |
| Inventive filter 1 | 84.0 | 5.46 | Iventive resin gel 1 | — |
| Comparative filter b | 85.0 | 2.49 | Comparative resin gel b | — |
| Comparative filter c | 83.0 | 1.24 | Comparative resin gel c | Too much resin gel applied |
| Inventive filter 2 | 87.0 | 5.65 | Iventive resin gel 2 | — |
| Comparative filter d | 88.0 | 2.10 | Comparative resin gel d | — |
| Comparative filter e | 88.0 | — | Comparative resin gel e | Incapable of applying resin gel |
| Inventive filter 3 | 87.0 | 4.60 | Iventive resin gel 3 | — |
| Comparative filter f | 86.0 | 2.98 | Comparative resin gel f | — |
| Comparative filter g | 79.0 | 1.78 | Comparative resin gel g | — |
| Inventive filter 4 | 82.0 | 4.32 | Iventive resin gel 4 | — |
| Comparative filter h | 84.0 | 2.42 | Comparative resin gel h | — |
| Comparative filter i | 80.0 | — | Comparative resin gel i | Incapable of applying resin gel |
| Inventive filter 5 | 84.0 | 3.98 | Iventive resin gel 5 | — |
| Comparative filter j | 86.0 | — | Comparative resin gel j | Incapable of applying resin gel |
| Comparative filter k | 74.0 | — | Comparative resin gel k | Incapable of applying resin gel |
| Inventive | 78.0 | 3.14 | Iventive | — |

TABLE 3-continued

| Bead filter No. | Impedance (Ω) | Bonding strength (kgf) | Resin gel No. | Remarks |
|---|---|---|---|---|
| filter 6 | | | resin gel 6 | |
| Comparative filter l | 70.0 | — | Comparative resin gel l | Incapable of applying resin gel |
| Comparative filter m | 68.0 | 2.22 | Comparative resin gel m | — |
| Inventive filter 7 | 74.0 | 5.47 | Iventive resin gel 7 | — |
| Comparative filter n | 74.0 | 2.42 | Comparative resin gel n | — |
| Comparative filter o | 61.0 | — | Comparative resin gel o | Incapable of applying resin gel |
| Inventive filter 8 | 75.0 | 4.71 | Iventive resin gel 8 | — |
| Comparative filter p | 74.0 | 2.83 | Comparative resin gel p | — |
| Comparative filter q | 79.0 | 1.22 | Comparative resin gel q | — |
| Inventive filter 9 | 74.0 | 4.39 | Iventive resin gel 9 | — |
| Comparative filter r | 72.0 | 2.11 | Comparative resin gel r | — |
| Comparative filter s | 74.0 | — | Comparative resin gel s | Incapable of applying resin gel |
| Inventive filter 10 | 76.0 | 5.13 | Iventive resin gel 10 | — |
| Comparative filter t | 75.0 | — | Comparative resin gel t | Incapable of applying resin gel |
| Conventional filter 1 | 63.91 | 5.10 | Resin based adhesive | — |
| Conventional filter 2 | 69.726 | 4.71 | Phenol based adhesive | — |

As shown in Table 3 above, the bead filters according to the present invention show impedances equal to or superior over the comparative filters or the conventional filters, while the bonding strength of the filters of the present invention is superior over the comparative filters and the conventional filters.

<EXAMPLE 2>

Bead filters were manufactured in the same manner as those of the inventive filters 1, 3, 6 and 9 of Table 3 above, except that the filtering was carried out by using a sieve of 325 meshes prior to defoaming the resin gels.

For the bead filters manufactured in the above described manner, impedances and bonding strengths were measured, and the measured results are shown in Table 4 below.

TABLE 4

| Bead filter No. | | Filtering. | Impedance (Ω). | Bonding strength (kgf) |
|---|---|---|---|---|
| Inventive filter | 1 | X | 84 | 5.46 |
| | | O | 83 | 5.55 |
| | 3 | X | 87 | 4.60 |
| | | O | 88 | 4.91 |
| | 6 | X | 78 | 3.14 |
| | | O | 77 | 4.11 |
| | 9 | X | 74 | 4.39 |
| | | O | 75 | 4.42 |

O: Filtering carried out.
X: Filtering not carried out.

As shown in Table 4 above, in the case where the resin gels were filtered prior to defoaming, the bonding strength was improved.

<EXAMPLE 3>

Bead filters were manufactured in the same manner as that of the inventive filter 1 of Table 3, except that the adhesive resin layer was dried for 3 minutes, and that the drying temperatures were varied as shown in Table 5 below.

For the bead filters manufactured in the above described manner, impedances and bonding strengths were measured, the measured results are shown in Table 5 below.

TABLE 5

| Bead filter No. | Drying temperature (°C.) | Impedance (Ω) | Bonding strength (kgf). | Remarks |
|---|---|---|---|---|
| Comparative filter u | 50 | 90 | 0.15 | Not dried. |
| Comparative filter v | 100 | 89 | 0.75 | Surface only dried. |
| Comparative filter w | 120 | 90 | 1.25 | Imperfectly dried. |
| Inventive filter 10 | 200 | 87 | 3.99 | — |
| Inventive filter 11 | 300 | 88 | 5.46 | — |
| Inventive filter 12 | 400 | 82 | 3.89 | Partial carbonization occurred. |
| Comparative filter x | 500 | 80 | 2.36 | Epoxy carbonized. |

As shown in Table 5 above, when carried out the drying of the adhesive resin layer according to the present invention, the bonding strengths were superior.

<EXAMPLE 4>

Bead filters were manufactured in the same manner as that of the inventive filter 1 of Table 3 above, except that the drying conditions for the adhesive resin layer were varied as shown in Table 6 below.

For the bead filters manufactured in the above described manner, impedances and bonding strengths were measured, and the measured results are shown in Table 6 below.

TABLE 6

| | | Drying conditons. | | | | | | | | |
|---|---|---|---|---|---|---|---|---|---|---|
| | | Pre-heating part | | Dring part | | Cooling part | | | Bonding | |
| Bead filter No. | | Temp (°C.) | Time (min) | Temp (°C.) | Time (min) | Temp (°C.) | Time (min) | impedance (Ω) | strength (kgf) | Remarks |
| Inventive filter | 1 | — | — | 300 | 3 | — | — | 88 | 5.46 | 1-step drying method |
| | 13 | 200 | 1.0 | 300 | 2.0 | — | — | 87 | 5.84 | 2-step drying zone method |
| | 14 | 200 | 1.0 | 350 | 2.0 | — | — | 86 | 5.72 | |
| | 15 | 100 | 0.5 | 300 | 1.5 | 200 | 1.0 | 86 | 6.01 | 3-step drying zone method |
| | 16 | 150 | 0.5 | 350 | 1.5 | 250 | 1.0 | 86 | 5.92 | |

As shown in Table 6 above, the 2-step and 3-step drying zone methods show superior bonding strength compared with the 1 step drying method.

According to the present invention as described above, the radial bead filters having superior electromagnetic characteristics and superior bonding strengths can be continuously manufactured with a simple process.

What is claimed is:

1. A method for manufacturing bead filters each including a lead wire and a pair of ferrite cores each having a through hole, for eliminating electromagnetic interference in electronic apparatus, comprising the steps of:

mixing 10–40 wt % of an epoxy powder and 60–90 wt % of an alcohol to prepare an epoxy resin gel having a viscosity of 30–100 cps;

defoaming said epoxy resin gel;

providing a plurality of lead wires;

identifying a portion of each said lead wire where said epoxy resin gel is to be applied;

inserting each of said lead wires into a through hole of each of said ferrite cores, and conveying said lead wires at spaced intervals from each other;

positioning each of said cores so that an epoxy resin gel applying portion of the lead wire has a predetermined position relative to the through hole of said ferrite core;

applying said defoamed epoxy resin gel to said epoxy resin gel applying portion of each of said lead wires;

rotatingly moving said ferrite core up to a final position on said lead wire after passing the applied epoxy resin gel so as to form an adhesive resin layer between the inside of said through hole and the outside of said lead wire; and drying the formed resin layer at a temperature of 150°–400° C., whereby said lead wire and said ferrite core are bonded together to form the bead filter.

2. The method as claimed in claim 1, wherein said epoxy powder is composed of, in weight %: 40–80% of resin, 10–50% of $SiO_2$, less than 20% of $Al_2O_3$, less than 10% of $Sb_2O_3$, and less than 5.0% of $TiO_2$, PbO, SnO and CaO.

3. The method as claimed in claim 2, wherein said epoxy powder is composed of, in weight %: 50–70% of resin, 25–40% of $SiO_2$, 1–13% of $Al_2O_3$, 2–5% of $Sb_2O_3$, and 0.1–2.0% of $TiO_2$, PbO, SnO and CaO.

4. The method as claimed in claim 1, wherein said epoxy powder is composed of, in weight %: 40–80% of resin, less than 20% of $SiO_2$, 10–50% of $Al_2O_3$, less than 10% of $Sb_2O_3$, and less than 5.0% of $TiO_2$, PbO, SnO and CaO.

5. The method as claimed in claim 4, wherein said epoxy powder is composed of, in weight %: 50–70% of resin, 1–13% of $SiO_2$, 25–40% of $Al_2O_3$, 2–5% of $Sb_2O_3$, and 0.1–2.0% of $TiO_2$, PbO, SnO and CaO.

6. The method as claimed in claim 1, wherein said epoxy resin gel contains by less than 8 wt % of one or two ingredients of a stabilizer (composed of acetone and ethyl alcohol) in a mixture of said epoxy powder and benzyl alcohol.

7. The method as claimed in claim 6, wherein said epoxy resin gel has a viscosity of 30–50 cps.

8. The method as claimed in claim 7, wherein said epoxy resin gel is filtered prior to defoaming.

9. The method as claimed in claim 7, wherein said epoxy resin gel is applied such that the length of said adhesive resin layer is equal to more than 50% of the length of said core.

10. The method as claimed in claim 6, wherein said epoxy resin gel is filtered by using a sieve prior to defoaming.

11. The method as claimed in claim 10, wherein said sieve has a fineness of 250–325 meshes.

12. The method as claimed in claim 11, wherein said epoxy resin gel is applied such that the length of said adhesive resin layer is equal to more than 50% of the length of said core.

13. The method as claimed in claim 10, wherein said epoxy resin gel is applied such that the length of said adhesive resin layer should be equivalent to more than 50% of the length of said core.

14. The method as claimed in claim 6, wherein said epoxy resin gel is applied such that the length of said adhesive resin layer is equal to more than 50% of the length of said core.

15. The method as claimed in claim 1, wherein said epoxy resin gel has a viscosity of 30–50 cps.

16. The method as claimed in claim 15, wherein said epoxy resin gel is filtered prior to defoaming.

17. The method as claimed in claim 15, wherein said epoxy resin gel is applied such that the length of said adhesive resin layer is equal to more than 50% of the length of said core.

18. The method as claimed in claim 1, wherein said epoxy resin gel is filtered prior to defoaming.

19. The method as claimed in claim 18, wherein said sieve has a fineness of 250–325 meshes.

20. The method as claimed in claim 18, wherein said epoxy resin gel is applied such that the length of said adhesive resin layer is equal to more than 50% of the length of said core.

21. The method as claimed in claim 1, wherein said epoxy resin gel is applied such that the length of said adhesive resin layer is equal to more than 50% of the length of said core.

22. The method of claim 1, wherein said alcohol is a benzyl alcohol.

23. The method of claim 1, wherein said epoxy resin gel is applied as a single coating before said rotatingly moving step.

24. The method of claim 1, wherein said defoamed epoxy resin gel is applied to an unheated epoxy resin gel applying portion of said lead wires.

25. A method for manufacturing bead filters each including a lead wire and a pair of ferrite cores each having a through hole, for eliminating electromagnetic interferences in electronic apparatuses, comprising the steps of:

mixing 10–40 wt % of an epoxy powder and 60–90 wt % of an alcohol to prepare an epoxy resin gel having a viscosity of 30–100 cps;

defoaming said epoxy resin gel;

storing said epoxy resin gel into adhesive storage tank after defoaming;

providing a plurality of U shaped lead wires;

fitting a pair of said ferrite cores to a said lead wire disposing such assemblies upon a base paper moving over a first guiding face of a first guiding part of a body portion, and taping to move said lead wires toward a drying furnace;

moving said cores fitted to said lead wires toward said first guiding part by means of a first inclined plate;

applying said epoxy resin gel to said lead wire by means of an adhesive applying wheel after said cores have been moved toward said first guiding part;

rotatingly moving said ferrite cores toward the epoxy resin gel applied portion by means of a second inclined plate which is installed between said adhesive applying wheel and said drying furnace so as to form an adhesive resin layer between the insides of the through holes and the outside of said lead wire; and carrying said ferrite cores to said drying furnace after the formation of said adhesive resin layer so as to dry said adhesive resin layer at a temperature of 150°–400° C.

26. The method as claimed in claim 25, wherein said epoxy resin gel contains by less than 8 wt % of one or two ingredients of a stabilizer (composed of acetone and ethyl alcohol) in a mixture of said epoxy powder and benzyl alcohol.

27. The method as claimed in claim 25, wherein said epoxy resin gel has a viscosity of 30–50 cps.

28. The method as claimed in claim 27, wherein said epoxy resin gel is applied to said lead wire by said applying wheel in an amount of 0.05–1.0 g based on a diameter 0.6 mm of said lead wire.

29. The method as claimed in claim 28, wherein said ferrite cores with said adhesive resin layers formed therein pass through said drying furnace with an inclination of less than 20°.

30. The method as claimed in claim 27, wherein said ferrite cores with said adhesive resin layers formed therein pass through said drying furnace with an inclination of less than 20°.

31. The method as claimed in claim 25, wherein said epoxy resin gel is applied to said lead wire 10 by said applying wheel in an amount of 0.05–1.0 g based on a diameter 0.6 mm of said lead wire.

32. The method as claimed in claim 31, wherein said ferrite cores with said adhesive resin layers formed therein pass through said drying furnace with an inclination of less than 20°.

33. The method as claimed in claim 25, wherein said ferrite cores with said adhesive resin layers formed therein pass through said drying furnace with an inclination of less than 20°.

34. The method of claim 25, wherein said alcohol is a benzyl alcohol.

35. The method of claim 25, wherein said epoxy resin gel is applied as a single coating before said rotatingly moving step.

36. The method of claim 25, wherein said defoamed epoxy resin gel is applied to an unheated epoxy resin gel applying portion of said lead wires.

* * * * *